United States Patent
Price et al.

[19]

[11] Patent Number: 6,133,768
[45] Date of Patent: Oct. 17, 2000

[54] BREAKDOWN VOLTAGE COMPENSATION CIRCUIT FOR WRITE DRIVER TRANSISTORS

[75] Inventors: John J. Price, Edina; Donald J. Schulte, Eagan, both of Minn.

[73] Assignee: Lucent Technologies Inc., Murray Hill, N.J.

[21] Appl. No.: 09/292,557

[22] Filed: Apr. 15, 1999

Related U.S. Application Data

[60] Provisional application No. 60/103,819, Oct. 8, 1998.

[51] Int. Cl.$^7$ .............................. H03B 1/00; H03K 3/00
[52] U.S. Cl. ........................................... 327/110; 327/362
[58] Field of Search ..................................... 327/108, 110, 327/53, 362, 538, 541–543; 323/315

[56] References Cited

U.S. PATENT DOCUMENTS

| | | | |
|---|---|---|---|
| 5,282,094 | 1/1994 | Ngo | 360/46 |
| 5,291,347 | 3/1994 | Ngo et al. | 360/68 |
| 5,612,828 | 3/1997 | Brannon et al. | 360/46 |

*Primary Examiner*—My-Trang Nuton
*Attorney, Agent, or Firm*—Kinney & Lange, P.A.

[57] ABSTRACT

A simulation circuit has a simulation circuit path that simulates operation of the write current circuit path of a write current driver. A simulation transistor simulates operation of the driver transistor and a monitor circuit monitors current at the base of the simulation transistor to derive a compensation current based on variations in base current, including breakdown of the simulation transistor. The compensation current is combined with the driver current to derive the write driver current for the driver transistor of the write current driver. In another form, the simulation circuit path is a scaled-down electrical equivalency of the write current circuit path so that the simulation current is a scaled fraction of the write current and power requirements are reduced. In one form, current is added to the compensation current to accommodate unidirectional nature of current mirrors in the monitor circuit.

18 Claims, 2 Drawing Sheets

BREAKDOWN VOLTAGE COMPENSATION CIRCUIT FOR WRITE DRIVER TRANSISTORS

CROSS-REFERENCE TO RELATED APPLICATION(S)

This application claims priority of Provisional Application No. 60/103,819 filed Oct. 8, 1998 for "CEO Breakdown Voltage Compensation for Write Driver H-Switch Transistors" by John J. Price, Jr. and Donald J. Schulte.

This application is related to Application No. (09/252, 502) for "Write Driver Circuit Having Programmable Overshoot and Undershoot" by John J. Price, Jr. and Donald J. Schulte and Application No. (09/292,294) for "Write Driver Circuit Having Enhanced Switching Control Circuitry" by John J. Price, Jr., both filed on even date herewith.

BACKGROUND OF THE INVENTION

This invention relates to write current drivers, and particularly to improvements in H-switches used to supply write current to magnetic recording heads.

H-switch drivers are used in magnetic disk drives to supply write current to the magnetic recording head to write data to recording disks. The H-switch is characterized by two or four semiconductor switches or the like, each forming a leg of the H, with the write head coil being connected to nodes across the center span of the H. A controlled electrode (e.g., collector or emitter) of each semiconductor switch is connected to one of the nodes. A programmed write current is applied to the H-switch and directed in either a first or second opposite direction between the nodes and through the head's coil by selectively operating the semiconductor switches to conduction. During the quiescent state when write current is flowing in a steady state condition in a given direction through the head, the voltages are nearly equal at both nodes, usually about a diode drop below the DC supply voltage to the circuit.

The DC supply voltage is applied to a controlled electrode (e.g., collector or emitter) of the switching semiconductors at the nodes of the H-switch, creating a voltage difference between that controlled electrode and the control electrode (e.g., base) of that semiconductor. Under some circumstances, that voltage can be large enough to break down the transistor, causing a breakdown current ($I_{BV}$) to flow out of the base of the transistor. The breakdown current adds to the write current supply, causing inaccuracy of the programmed write current and adversely affecting the performance of the H-switch.

The present invention is directed to a compensation circuit that operates a simulation transistor under conditions that simulate operation of the H-switch transistors susceptible of breakdown, and that senses breakdown of the simulation transistor to generate a compensation current that is combined with the write current to the H-switch.

BRIEF SUMMARY OF THE INVENTION

In one form of the invention, a write current driver circuit has a current driver transistor having a base arranged to be operated by a write driver current to supply a write current to an inductive load through a write current circuit path that includes a controlled element of the current driver transistor. A write current compensation circuit includes a simulation circuit having a simulation transistor. The simulation transistor has a base arranged to be operated by a current representative of the write driver current. The simulation transistor supplies a current to a simulation load through a simulation circuit path that simulates operation of the write current circuit path. A sense circuit is connected to the base of the simulation transistor to supply a compensation current to an output based on current in the base of the simulation semiconductor device. A summer is connected to the output of the sense circuit to combine the compensation current to the write driver current.

In one form of the invention, the current driver transistor is part of a first current mirror whose mirroring transistor is operated by the write driver current to mirror the write driver current to supply the write current to the inductive load. The simulation circuit further includes a second current mirror that includes the simulation transistor and a second mirror transistor. The second mirror transistor is operated by the current representative of the write driver current so that the simulation transistor mirrors the current representative of the write driver current to the simulation load.

In a preferred form of the invention, a first current source is connected to the base of the simulation transistor to supply a predetermined current. The sense circuit includes a monitor transistor having a first controlled element connected to the base of the simulation transistor. The monitor semiconductor provides a current representative of the sum of (i) current into the base of the second mirror semiconductor device, (ii) the current into or out of the base of the simulation transistor, and (iii) the current supplied by the first current source. A first circuit is connected to the monitor transistor to carry a current representative of the write driver current, and a second circuit is connected to the monitor transistor to carry a current representative of the sum of the current into or out of the base of the simulation transistor, and the current supplied by the first current source. The second circuit includes a second current source for subtracting the current supplied by the first current source to derive the compensation current.

The current in the base of the simulation transistor may be into or out of the base of the transistor, depending on whether the transistor is in normal bias mode or in breakdown. As a result, the current may be bidirectional. The current is increased and later decreased to accommodate the uni-directional nature of the current mirrors in the circuit.

Another optional and desirable feature of the invention resides in the simulation transistor being a scaled down version of the drive transistor so that the simulation semiconductor device supplies simulation current to the simulation circuit path so that operation of the simulation circuit path is electrically equivalent to operation of the write current circuit path by the write current. Thus, the simulation circuit path is a scaled-down electrical equivalency of the write current circuit path and the simulation current is a fraction of the write current, the fraction being related to the equivalency scale. This permits the simulation circuit to operate at reduced power, thereby reducing the current draw of the simulation circuit and the heat associated therewith, and reducing the power required for the simulation circuit.

DETAILED DESCRIPTION

Figure 1:
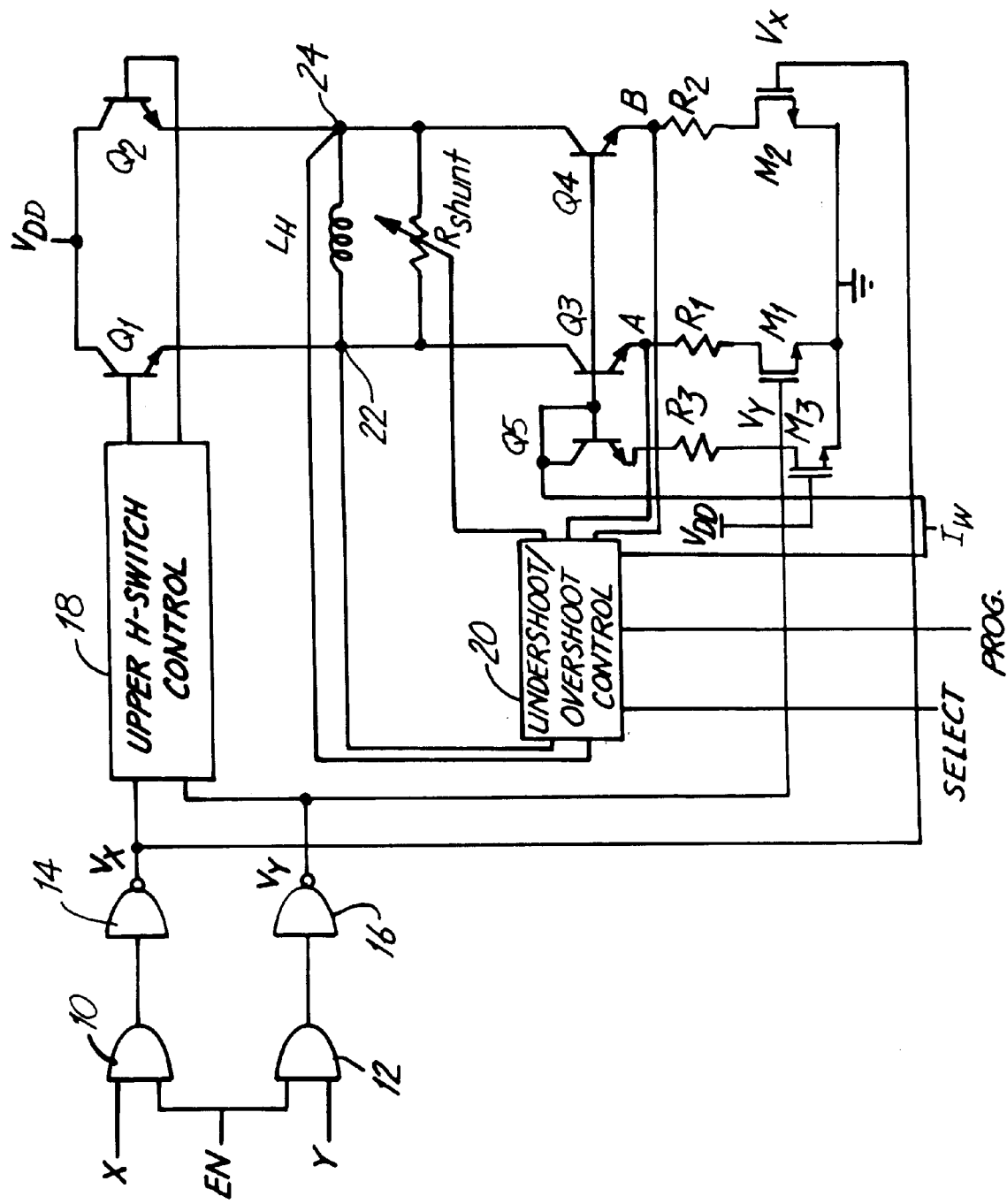
FIG. 1 is a block/circuit diagram of an H-switch write current driver circuit employing a compensation circuit according to the presently preferred embodiment of the present invention.

FIG. 1 is a block/circuit diagram of an H-switch write current driver circuit, as more fully described in the aforementioned Price and Schulte applications. The driver circuit, in its most basic form, comprises NPN transistors $Q_1$–$Q_4$. Transistors $Q_1$ and $Q_2$ have their collectors connected to DC voltage source $V_{DD}$ and their emitters connected to respective terminals 22 and 24. Transistors $Q_3$ and $Q_4$ have their collectors connected to terminals 22 and 24. Transistors $Q_3$ and $Q_4$ also form current mirrors with NPN transistor $Q_5$, which is connected to a write current source $I_W$ to mirror the write current into transistors $Q_3$ and $Q_4$. The emitter of transistor $Q_5$ is connected to ground through resistor $R_3$ and MOSFET $M_3$, with the gate of MOSFET $M_3$ being connected to voltage source $V_{DD}$. The current mirrors are completed through the emitters of $Q_3$ and $Q_4$, resistors $R_1$ and $R_2$ and respective MOSFETs $M_1$ and $M_2$ connected to ground. A magnetic write head in the form of an inductive load $L_H$ is connected between terminals 22 and 24. Data signals representing data to be recorded are provided at terminals X and Y to one input of respective AND gates 10 and 12, the second input of each AND gate 10 and 12 being connected to receive a write enable signal. The data signals are inverted by inverters 14 and 16 to derive transistor driving signals $V_X$ and $V_Y$ which are supplied through upper H-switch control circuit 18 to selectively operate one or the other of transistors $Q_1$ and $Q_2$, and to the control terminals of MOSFETs $M_1$ and $M_2$ to selectively operate one or the other of current mirrors $Q_3$ and $Q_4$. Upper H-switch control 18 is described in greater detail in Application No. (09/292,294) Undershoot/overshoot control 20 is connected to inductive load $L_H$ and to the emitters of transistors $Q_3$ and $Q_4$ and to the control terminal of resistor $R_{SHUNT}$ to selectively operate and program overshoot and undershoot of the H-switch circuit in a manner more fully described in Application No. (09/292,502).

The H-switch is a symmetrical circuit, with the two write current paths being electrically balanced. Thus, the current path through transistor $Q_1$, terminal 22, load $L_H$, terminal 24, transistor $Q_4$, resistor $R_2$ and MOSFET $M_2$ exhibits the same resistance, capacitance (including parasitic capacitance), inductance and switching characteristics, as the current path through transistor $Q_2$, terminal 24, load $L_H$, terminal 22 transistor $Q_3$, resistor $R_1$ and MOSFET $M_1$. Where a current mirror is employed to supply write current to the load, as in the case of the circuit illustrated in FIG. 1, the mirror usually employs a scaling ratio to scale up the write current $I_W$ supplied to the current mirror driver $Q_5$ to some multiple of $I_W$ to supply to the load. The circuit illustrated in FIG. 1 will be described with a scaling ratio of 1 to 12 so that a write current $I_W$ of 5 milliamps supplied to current mirror driver $Q_5$ will cause mirrors $Q_3$ and $Q_4$ to supply a 60 milliamp write current to the load.

The H-switch write current driver illustrated in FIG. 1 is operated by applying complementary data signals X and Y to AND gates 10 and 12 to selectively operate transistors $Q_1$ and $Q_2$ and MOSFETs $M_1$ and $M_2$. Thus, when $V_X$ is high and $V_Y$ is low, upper H-switch control operates transistor $Q_1$ to conduction and operates transistor $Q_2$ to non-conduction. Additionally, MOSFET $M_2$ is operated to conduction so that current mirror $Q_4$ provides a scaled-up write current (e.g., 12 times the value of $I_W$) to flow through load $L_H$ in the direction from terminal 22 to terminal 24, while MOSFET $M_1$ is operated to non-conduction so that current mirror $Q_3$ is inhibited from providing current to the load. Conversely, when $V_Y$ is high and $V_X$ is low, upper H-switch control 18 operates transistor $Q_2$ to conduction and transistor $Q_1$ to non-conduction, MOSFET $M_1$ is operated to conduction permitting current mirror $Q_3$ to provide the scaled-up write current through inductive load $L_H$ in the direction from terminal 24 to terminal 22, and MOSFET $M_2$ is operated to non-conduction to inhibit current mirror $Q_4$ from supplying current to the load.

One problem of H-switch write current drivers is that a large collector-base voltage in a transistor $Q_3$ or $Q_4$ adversely affects write current accuracy. If the voltage is large enough, the transistor can break down, causing a current to flow out of the base of the transistor and into the write current supply $I_W$. This current due to breakdown adds to the write current supply $I_W$, causing an inaccuracy in the programmed write current and adversely affecting desired performance of the circuit. Moreover, where a current mirror is employed as part of the H-switch, as in the circuit of FIG. 1, the current due to breakdown flowing out of the base of the current mirror is multiplied by the mirror ratio so that the inaccuracy in write current to the load can be large.

Figure 2:
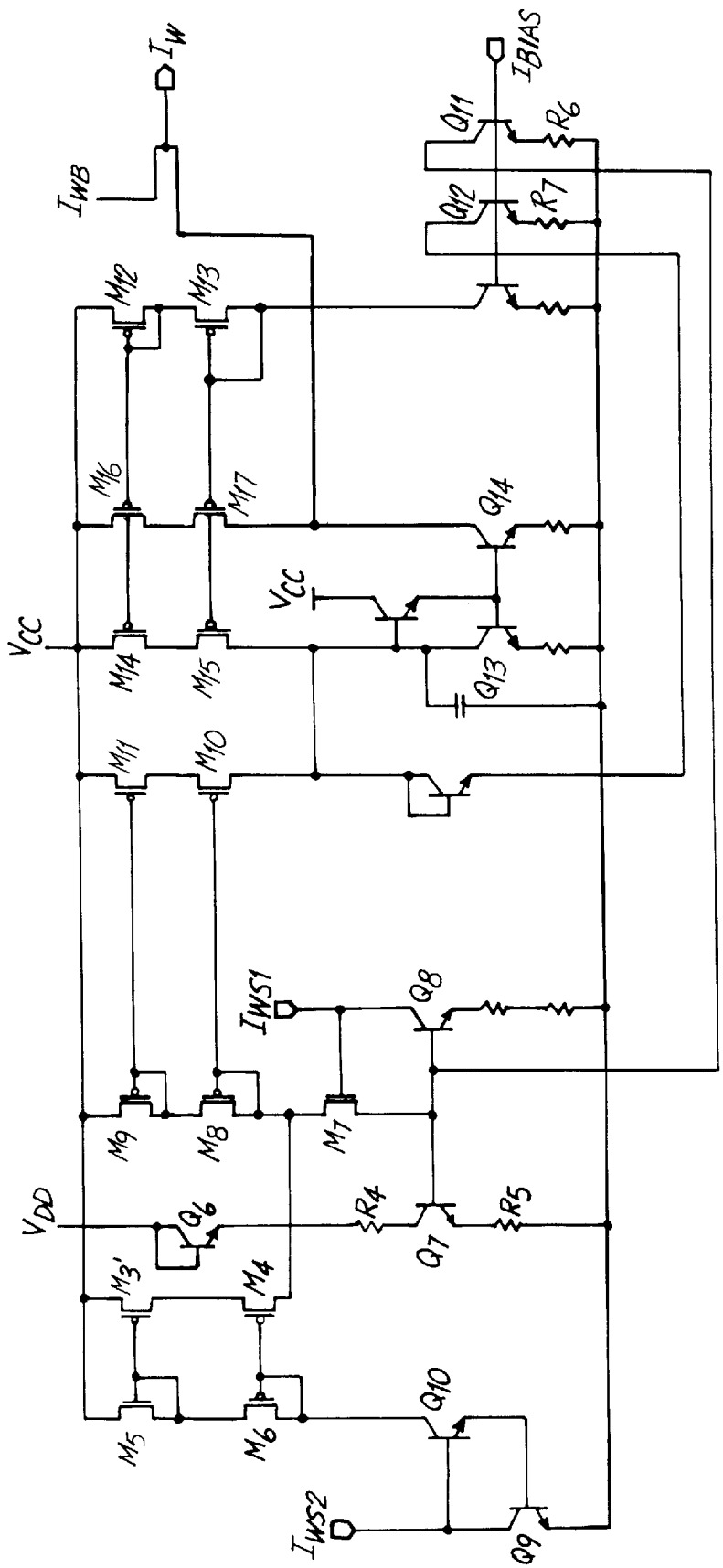
FIG. 2 is a circuit diagram of a compensation circuit used with the H-switch write current driver circuit of FIG. 1.

FIG. 2 is a circuit diagram of a compensation circuit for deriving a compensation write current for the H-switch circuit illustrated in FIG. 1 to compensate the effects of breakdown of an H-switch transistor. Transistor $Q_6$ simulates the active one of transistors $Q_1$ and $Q_2$, (FIG. 1), and transistor $Q_7$ represents the active one of transistors $Q_3$ and $Q_4$ (FIG. 1). Resistor $R_4$ simulates the inherent resistance of head $L_H$ and the resistance appearing at the emitter of the active one of transistors $Q_1$ and $Q_2$, and resistor $R_5$ simulates the resistance appearing at the emitter of the active one of transistors $Q_3$ and $Q_4$, including resistor $R_1$ or $R_2$ and MOSFET $M_1$ or $M_2$. Thus, the circuit path between $V_{DD}$ and ground through transistors $Q_6$ and $Q_7$ illustrated in FIG. 2 represents an active side of an H-switch through head $L_H$ via transistors $Q_1$ and $Q_4$, resistor $R_2$ and MOSFET $M_2$, or via transistors $Q_2$ and $Q_3$, resistor $R_1$ and MOSFET $M_1$.

Transistor $Q_7$ is a ⅛ scaled device to the NPN transistors $Q_1$–$Q_4$ used in the H-switch and is biased at the same current density as the H-switch NPN transistors $Q_1$–$Q_4$ by a 1 to 4.5 current mirror gain from transistor $Q_8$ and a DC input current $I_{WS1}$. Input current $I_{WS1}$ is a scaled down version of write current $I_W$ that is applied to transistor $Q_5$. The gain of the $Q_8$–$Q_7$ mirror and the value of input current $I_{WS1}$ are chosen so that the current through simulation path comprising $Q_6$, $R_4$, $Q_7$, and $R_5$ is 3 ma., compared to a write current of 60 ma through head $L_H$. The collector load on $Q_7$ is scaled such that the collector-emitter voltage of $Q_7$ matches the collector-emitter voltage of transistors $Q_3$ and $Q_4$. Therefore the base current and the collector-emitter breakdown voltage of transistor $Q_7$ accurately track the base current and collector-emitter breakdown voltage of transistors Q3 and Q4 for accurate simulation. With $I_{WS1}$ active, transistor $Q_8$ mirrors current $I_{WS1}$ into transistor $Q_7$ to operate the simulation circuit.

For normal base current compensation (no breakdown of transistor $Q_7$), current through MOSFET $M_7$ flows into (i) the base of transistor $Q_7$, (ii) the base of transistor $Q_8$ and (iii) a fixed 14.3 μa current drain formed of transistor $Q_{11}$ and resistor $R_6$. Therefore, for normal base current compensation, the current from the source of MOSFET $M_7$ equals the current into the base of transistor $Q_7$ ($I_{B7}$), plus the base current of transistor $Q_8$ ($I_{B8}$), plus 14.3 μa ($I_{M7}$=$I_{B7}$+$I_{B8}$+14.3 μa). On the other hand, upon breakdown of transistor $Q_7$, current due to breakdown flows out of the base of transistor $Q_7$. Consequently, the junction at the source of MOSFET $M_7$ and the bases of transistors $Q_7$ and $Q_8$ receives current from the source of MOSFET $M_7$ and from the base of transistor $Q_7$, and sinks current into the base of transistor $Q_8$ and the fixed 14.3 μa current drain formed of transistor $Q_{11}$ and resistor $R_6$. The 14.3 μa current source provides bias current to MOSFET $M_7$ when transistor $Q_7$ is operated in the breakdown mode and current is flowing out of its base. Therefore, upon breakdown of transistor $Q_7$, the current through MOSFET $M_7$ equals the current into the base of transistor $Q_8$ ($I_{B8}$), plus 14.3 μa, minus the current due to breakdown out of transistor $Q_7$ ($I_{B7}$), ($I_{M7}=I_{B8}+14.3 μa-I_{B7}$). Therefore, the current through MOSFET $M_7$ is based on the base currents of transistors $Q_7$ and $Q_8$ and the 14.3 μa current sunk into the current sink of transistor $Q_{11}$ and resistor $R_6$.

The base current of transistor $Q_8$ ($I_{B8}$) is removed from the current through MOSFET $M_7$ by the circuit comprising transistors $Q_9$ and $Q_{10}$ and the cascoded MOS mirror $M_5$–$M_3$. Input current $I_{WS2}$ is a copy of current $I_{WS1}$ and is a scaled down version of the write current $I_W$. Input current $I_{WS2}$ biases up transistor $Q_9$ at the same current density as transistor $Q_8$. Therefore, the base current of transistor $Q_9$, which flows in the collector of transistor $Q_{10}$, matches the base current of transistor $Q_8$. This current in transistor $Q_{10}$ is mirrored to the drain of MOSFET $M_7$ where it is subtracted from the current applied to MOSFET $M_8$. Thus, the current into the drain of MOSFET $M_7$ equals the current from MOSFET $M_8$ plus the current mirrored from $I_{WS2}$. Since that latter current equals the $I_{B8}$ current, the current through MOSFET $M_8$ is 14.3 μa±$I_{B7}$, depending on whether current is into or out of transistor $Q_7$, and therefore depending on whether transistor $Q_7$ is in a breakdown mode or not.

The 14.3 μa current from MOSFET $M_7$ is removed by gaining up the resulting current at the drain of MOS $M_7$ by 14 times via the cascoded current mirror comprising MOSFETs $M_8$, $M_9$, $M_{10}$, and $M_{11}$. The resultant current, which is 14 times the sum of the base current of transistor Q7 and the 14.3 μa current source (14)[14.3 μa±$I_{B7}$]), flows from the drain of MOSFET $M_{10}$. A current source comprising transistor $Q_{12}$ and resistor $R_7$ operates to sink a 200 μa current from the current at the drain of MOSFET $M_{10}$. This effectively removes the fixed 14.3 μa current that had been added in before the scaling up by 14 times by the current mirror of MOSFETs $M_8$–$M_{11}$. Therefore, at the node at the drains of MOSFETs $M_{10}$ and $M_{15}$, the current is ±14 $I_{B7}$. The gaining up of $I_{B7}$ provides a compensation current at approximately the same scale as write current $I_W$.

Next, the current is mirrored to the output for summation with the base write current $I_{WB}$. Since the compensation current is based on the $I_{B7}$ current, which in turn is based on either normal base current compensation or breakdown, the compensation current component of the current through MOSFET $M_{10}$ may be flowing into or out of the node at the drain of MOSFET $M_{10}$, depending on how transistor $Q_7$ is operating. However, current mirrors are not bi-directional, meaning that it is possible to mirror only a uni-directional current. The 14.3 μa current supplied by the current source of transistor $Q_{11}$ and resistors assures that the cascoded current mirror of MOSFETs $M_8$, $M_9$, $M_{10}$, and $M_{11}$ operates on a uni-directional current, regardless of whether or not transistor $Q_7$ is in a breakdown mode. Similarly, a fixed 200 μa current is added to the compensation current (±14 $I_{B7}$) via the cascoded current source $M_{14}$, $M_{15}$ from mirror driver $M_{12}$, $M_{13}$. The resultant current (200 μa±14 $I_{B7}$) is mirrored to the output at the drain of MOSFET $M_{17}$ through a one-to-one NPN mirror comprised of transistors $Q_{13}$–$Q_{14}$. The fixed 200 μa current that was added on the driver side of the one-to-one $Q_{13}$–$Q_{14}$ current mirror is then subtracted back out by another fixed 200 μa current from cascoded current mirror $M_{16}$, $M_{17}$ to generate the actual compensation current (±14 $I_{B7}$) which is then combined with the basic write current $I_W$ to derive the write current $I_W$ for the H-switch. The one-to-one $Q_{13}$–$Q_{14}$ current mirror thus inverts the polarity of the ±14 $I_{B7}$ current from a current source at MOSFETs $M_{10}$ and $M_{11}$ to a current sink at transistor $Q_{14}$ to derive the compensation current.

The circuit operates whether current is flowing into the base of the reference transistor $Q_7$ for bias purposes or out of the reference transistor $Q_7$ during breakdown. The 14.3 μa and 200 μa fixed current sources that are added in and subsequently subtracted back out allow the uni-directional current mirrors to function correctly with the bi-directional current behavior of the sensing current. The compensation circuit thus serves two functions. First, it provides base current compensation for the base current that is lost via the 1 to 12 current mirror between mirror driver $Q_5$ and mirrors $Q_3$ and $Q_4$. Second, the circuit compensates for the CEO breakdown of transistors $Q_3$ and $Q_4$.

As described above, the cascoded current mirror of MOSFETs $M_8$–$M_{11}$ provide a 14 times gain. A gain of 12 times would adequate, but experimentation revealed that accuracy is enhanced by gaining up by 14 times and then subtracting 1.5 times the base current of transistor Q8. This technique results in curvature of the write current Iw over a range of $V_{DD}$ between 4.5 and 10 volts.

Although the present invention has been described with reference to preferred embodiments, workers skilled in the art will recognize that changes may be made in form and detail without departing from the spirit and scope of the invention.

What is claimed is:

1. In a write current driver circuit having a current driver semiconductor device having a control element arranged to be operated by a write driver current to supply a write current to an inductive load through a write current circuit path that includes a controlled element of the current driver semiconductor device, the improvement of a write current compensation circuit comprising:

a simulation circuit having a simulation semiconductor device having a control element arranged to be operated by a current representative of the write driver current to supply a current to a simulation load through a simulation circuit path that simulates operation of the write current circuit path;

a sense circuit connected to the control element of the simulation semiconductor device to supply a compensation current to an output of the sense circuit based on current in the control element of the simulation semiconductor device; and a summer connected to the output of the sense circuit for adding the compensation current to the write driver current.

2. The apparatus of claim 1, including a first current mirror that includes the current driver semiconductor device and a first mirror semiconductor device arranged to be operated by the write driver current, the control element of the current driver semiconductor device being connected to the first mirror semiconductor device so that the write driver current is mirrored to the current driver semiconductor device to supply the write current to the inductive load, wherein the simulation circuit further includes a second current mirror including the simulation semiconductor device and a second mirror semiconductor device arranged to be operated by the current representative of the write driver current, the control element of the simulation semiconductor device being connected to the second mirror semiconductor device so that the current representative of the write driver current is mirrored to the simulation semiconductor device to supply current to the simulation load.

3. The apparatus of claim 2, wherein the sense circuit includes
   a monitor semiconductor device having a first controlled element connected to the control element of the simulation semiconductor device and having a second controlled element, the monitor semiconductor device providing a current between its first and second controlled elements representative of the sum of (i) current into a control element of the second mirror semiconductor device and (ii) the current into or out of the control element of the simulation semiconductor device,
   a first circuit associated with the second controlled element carrying a current representative of current into the control element of the second mirror semiconductor device, and
   a second circuit associated with the second controlled element carrying a current representative of the current into or out of the control element of the simulation semiconductor device.

4. The apparatus of claim 3, wherein the first circuit includes a third current mirror providing a current representative of the write driver current.

5. The apparatus of claim 4, including
   a first current source connected to the first controlled element of the monitor semiconductor device, the first current source providing a first predetermined current to the monitor semiconductor device so that the monitor semiconductor device provides a current between its first and second controlled elements representative of the sum of (i) the current into the control element of the second mirror semiconductor device, (ii) the current into or out of the control element of the simulation semiconductor device and (iii) the first predetermined current,
wherein the second circuit carries current representative of the sum of (i) the current into or out of the control element of the simulation semiconductor device and (ii) the first predetermined current, the second circuit including
   a fourth current mirror mirroring the current representative of the sum of (i) the current into or out of the control element of the simulation semiconductor device and (ii) the first predetermined current,
   a second current source connected to an output of the fourth current mirror for sinking a second predetermined current from the output of the fourth current mirror, the second predetermined current being representative of the first predetermined current, and
   an output of the second circuit connected to the output of the fourth current mirror and to the second current source for providing a current representative of the current into or out of the control element of the simulation semiconductor device.

6. The apparatus of claim 5, including an output circuit having an input connected to the output of the second circuit, the output circuit including:
   a third current source providing a third predetermined current to the input of the output circuit,
   a fifth current mirror connected to the input of the output circuit for mirroring a current representative of the sum of (i) the third predetermined current and (ii) the current into or out of the control element of the simulation semiconductor device to an output of the third current mirror, and
   a fourth current source providing a fourth predetermined current to the output of the fifth current mirror to subtract a current equal to the fourth predetermined current from current at the output of the fifth current mirror, the fourth predetermined current being representative of the third predetermined current.

7. The apparatus of claim 3, including
   a first current source connected to the first controlled element of the monitor semiconductor device, the first current source providing a first predetermined current to the monitor semiconductor device so that the monitor semiconductor device provides a current between its first and second controlled elements representative of the sum of (i) the current into the control element of the second mirror semiconductor device, (ii) the current into or out of the control element of the simulation semiconductor device and (iii) the first predetermined current,
wherein the second circuit carries current representative of the sum of (i) the current into or out of the control element of the simulation semiconductor device and (ii) the first predetermined current, the second circuit including
   a fourth current mirror mirroring the current representative of the sum of (i) the current into or out of the control element of the simulation semiconductor device and (ii) the first predetermined current,
   a second current source connected to an output of the fourth current mirror for sinking a second predetermined current from the output of the fourth current mirror, the second predetermined current being representative of the first predetermined current, and
   an output of the second circuit connected to the output of the fourth current mirror and to the second current source for providing a current representative of the current into or out of the control element of the simulation semiconductor device.

8. The apparatus of claim 7, including an output circuit having an input connected to the output of the second circuit, the output circuit including:
   a third current source providing a third predetermined current to the input of the output circuit,
   a fifth current mirror connected to the input of the output circuit for mirroring a current representative of the sum of (i) the third predetermined current and (ii) the current into or out of the control element of the simulation semiconductor device to an output of the third current mirror, and
   a fourth current source providing a fourth predetermined current to the output of the fifth current mirror to subtract a current equal to the fourth predetermined current from current at the output of the fifth current mirror, the fourth predetermined current being representative of the third predetermined current.

9. The apparatus of claim 3, including
   a first current soure providing a first predetermined current to the control element of the simulation semiconductor device, the monitor semiconductor device providing a current representative of the sum of (i) current into a control element of the second mirror semiconductor device, (ii) the first predetermined current and (iii) the current into or out of the control element of the simulation semiconductor device,
   the first circuit including a third current mirror providing a current representative of the write driver current,
   the second circuit carrying a current representative of the sum of (i) the predetermined current and (ii) the current into or out of the control element of the simulation semiconductor device, the second circuit further including a fourth current mirror connected to the second controlled element of the monitor semiconductor device to mirror the current representative of the sum of (i) the first predetermined current and (ii) the current into or out of the control element of the simulation semiconductor device, a second current source connected to an output of the fourth current mirror to provide a second predetermined current representative of the first predetermined current, the fourth current mirror and second current source operable to provide current representative of the current into or out of the control element of the simulation semiconductor device, a third current source connected to the fourth current mirror to add a second predetermined current to the current provided by the fourth current mirror and second current source, a fifth current mirror for mirroring a current representative of the sum of the second predetermined current and the current representative of the current into or out of the control element of the simulation semiconductor device to an output of the sense circuit, and a fourth current source connected to the output of the sense circuit for removing a current representative of the second predetermined current from the sum of the second predetermined current and the current representative of the current into or out of the control element of the simulation semiconductor device to derive the compensation current representative of the current into or out of the control element of the simulation semiconductor device.

10. The apparatus of claim 9, wherein the simulation semiconductor device provides simulation current to the simulation circuit path so that operation of the simulation circuit path is electrically equivalent to operation of the write current circuit path by the write current, the simulation circuit path being a scaled-down electrical equivalency of the write current circuit path and the simulation current being a fraction of the write current, the fraction being related to the equivalency scale.

11. The apparatus of claim 3, wherein the simulation semiconductor device provides simulation current to the simulation circuit path so that operation of the simulation circuit path is electrically equivalent to operation of the write current circuit path by the write current, the simulation circuit path being a scaled-down electrical equivalency of the write current circuit path and the simulation current being a fraction of the write current, the fraction being related to the equivalency scale.

12. The apparatus of claim 1, wherein the simulation semiconductor device provides simulation current to the simulation circuit path so that operation of the simulation circuit path is electrically equivalent to operation of the write current circuit path by the write current, the simulation circuit path being a scaled-down electrical equivalency of the write current circuit path and the simulation current being a fraction of the write current, the fraction being related to the equivalency scale.

13. A process for compensating the write current supplied by a write driver circuit to an inductive load of a write current circuit path, the write driver circuit having a driver semiconductor having a control element arranged to be operated by a driver current and a controlled element for supplying write current to the load, the process comprising:

applying a representation of the driver current to the control element of a simulation semiconductor in a simulation circuit path that includes the simulation semiconductor and a simulation load so that the simulation semiconductor simulates operation of the driver semiconductor;

monitoring the current at the control element of the simulation semiconductor to derive a compensation current; and adding the compensation current to the driver current.

14. The process of claim 13, wherein the current at the control element of the simulation semiconductor is monitored by providing a current representative of the driver current and a current into of out of a control element of the simulation semiconductor, and subtracting a current representative of the driver current.

15. The process of claim 13, wherein a first current mirror includes the driver semiconductor and a first mirror semiconductor operated by the driver current, the control element of the driver semiconductor being connected to the first mirror semiconductor device to mirror the driver current to supply the write current to the inductive load, the process further including operating the simulation semiconductor device in a second current mirror wherein the control element of the simulation semiconductor is connected to a second mirror semiconductor and the simulation semiconductor mirrors the current representative of the write driver current to the simulation load, the monitoring of the current at the control element of the simulation semiconductor includes providing current at the control element of the simulation semiconductor through a monitoring semiconductor, and subtracting a current representative of current into the second mirror semiconductor from the current through the monitoring semiconductor.

16. The process of claim 15, wherein current is provided through the monitoring semiconductor by combining a first predetermined current with the current into the second mirror transistor and the current into or out of the control element of the simulation semiconductor, and passing the combined current through the monitoring semiconductor, and wherein the process further includes subtracting a current from the current through the monitoring semiconductor representative of the first predetermined current.

17. The process of claim 16, including combining a second predetermined current with the current through the monitoring semiconductor to derive a current representative of the sum of the second predetermined current and current into or out of the control element of the simulation semiconductor, and subtracting a current representative of the second predetermined current from the summed current at the output to derive the compensation current.

18. The process of claim 13, wherein the simulation semiconductor provides simulation current to the simulation circuit path so that operation of the simulation circuit path is electrically equivalent to operation of the write current circuit path by the write current, the simulation circuit path being a scaled-down electrical equivalency of the write current circuit path and the simulation current being a fraction of the write current, the fraction being related to the equivalency scale.

* * * * *

UNITED STATES PATENT AND TRADEMARK OFFICE
CERTIFICATE OF CORRECTION

PATENT NO.    : 6,133,768
DATED         : October 17, 2000
INVENTOR(S)   : John J. Price Jr. et al.

It is certified that error appears in the above-identified patent and that said Letters Patent is hereby corrected as shown below:

Title page,
Item [75], "Inventors" after "Price", insert -- Jr. --

Column 1,
Line 12, delete "(09/252,502)", insert -- (09/292,502) --

Column 8,
Line 53, delete "soure", insert -- source --

Signed and Sealed this

Nineteenth Day of March, 2002

Attest:

JAMES E. ROGAN
*Director of the United States Patent and Trademark Office*

*Attesting Officer*